United States Patent [19]
Yoshida

[11] Patent Number: 6,024,485
[45] Date of Patent: Feb. 15, 2000

[54] ERROR CORRECTION CODING AND DECODING METHOD, AND CIRCUIT USING SAID METHOD

[75] Inventor: Hideo Yoshida, Kamakura, Japan

[73] Assignee: Mitsubishi Denki Kabushiki Kaisha, Tokyo, Japan

[21] Appl. No.: 08/652,301

[22] Filed: May 23, 1996

[30] Foreign Application Priority Data

May 30, 1995 [JP] Japan ................................. 7-132461

[51] Int. Cl.$^7$ ................................................. H03M 13/00
[52] U.S. Cl. ............................................................. 371/37.11
[58] Field of Search ............................. 371/37.1, 40.14, 371/47.1, 37.11

[56] References Cited

U.S. PATENT DOCUMENTS

| | | | |
|---|---|---|---|
| 4,782,490 | 11/1988 | Tenengolts | 371/40 |
| 4,856,003 | 8/1989 | Weng | 371/37.1 |
| 4,897,839 | 1/1990 | Yamagishi et al. | 371/37.1 |
| 4,972,417 | 11/1990 | Sako et al. | 371/37.4 |
| 5,345,451 | 9/1994 | Uriu et al. | 371/42 |
| 5,428,627 | 6/1995 | Gupta | 371/37.1 |
| 5,428,630 | 6/1995 | Weng et al. | 371/40.1 |
| 5,615,210 | 3/1997 | Kaiyama et al. | 370/389 |

FOREIGN PATENT DOCUMENTS

| | | |
|---|---|---|
| 53-5099 | 12/1971 | Japan . |
| 54-19312 | 2/1979 | Japan . |
| 58-78241 | 5/1983 | Japan . |
| 60-142430 | 7/1985 | Japan . |

OTHER PUBLICATIONS

Glover, N., et al., "Practical Error Correction Design for Engineers", Second Ed., Dec 1988, pp. 256–269.

Douglas C. Bossen, Lih C. Chang & Chin–Long Chen "Measurement and Generation of Error Correcting Codes for Package Failures" 1978 IEEE pp. 201–204.

C. L. Chen & M. Y. Hsiao "Error–Correcting Codes for Semiconductor Memory Applications: A State–of–the–Art Review" IBM J. Res. Develop., Mar. 1984 pp. 124–134.

Shigeo Kaneda "A Class of Odd–Weight–Column SEC–D–ED–SbED Codes for Memory System Applications" IEEE 1984 pp. 737–739.

*Primary Examiner*—Stephen M. Baker

[57] ABSTRACT

In the coding and decoding of Reed-Solomon codes formed of symbols larger than information symbols, redundant circuitry is eliminated, error detection and correction are preformed using a simple construction, and the reliability of error detection and correction is improved by processing only data of the same size as the information symbols. Two bits of dummy data which are surplus bits in 10 bits of one symbol of information are supplied from a dummy data input circuit to 8 bit input data. At the same time, syndrome data is generated from the surplus parts of check symbols by a syndrome data correction circuit. A part of the 10 bit data is selected by a selector, and supplied to a Galois field summation circuit. The output of the Galois field summation circuit is output to a register, and the output of this register is either selected without modification or via a Galois field coefficient multiplying circuit by a selector, and supplied to the Galois field summation circuit. The output of the register is output as syndrome data by a syndrome output terminal.

12 Claims, 17 Drawing Sheets

ERROR CORRECTION CODING AND DECODING METHOD, AND CIRCUIT USING SAID METHOD

DETAILED DESCRIPTION OF THE INVENTION

1. Field of the Invention

This invention relates to an error correction coding/decoding method and circuit, and more specifically, to a method of coding/decoding Reed-Solomon codes formed of symbols larger than information symbols when data is transmitted such as in data transfer and data recording, and a circuit for implementing this method.

2. Background of the Invention

Error correction coding is often used when digital information is transmitted. "Code Theorem" edited by the Institute of Electronic Information Communication (Denshi Joho Tsushin Gakkairon), written by Hideo Imai, first edition published on Mar. 15, 1990, various error correction coding and decoding techniques are disclosed. One of these is Reed-Solomon coding, a method which performs symbol error correction on a symbol of 8 bits, which has high compatibility with computers or digital instruments, and which is therefore widely used for information transfer or recording.

Flash memories, which in addition to permitting write erase can store data even without power and achieve higher levels of integration than DRAM, are now attracting interest, and it is hoped to use them as memory devices. However flash memories suffer from the disadvantage that when a large number of writes and erasures are performed, internal cells are damaged and data can be destroyed. Error correction is therefore often used when data is recorded on flash memories. Further when data is erased, all data becomes "1", so this is used to verify the erasure.

In general, when data is recorded on a disk memory, 512 bytes of information data are stored as one sector. Also as memories store data in units of 8 bits, a Reed-Solomon code is used whereof 8 bits comprise one symbol. However in such a Reed-Solomon code wherein 8 bits comprise one symbol, the coding length is generally limited to 255, and consequently the data has to be split into a plurality of code words. Alternatively, for example, data may be protected by a Reed-Solomon code wherein one symbol is 10 bits. In this case it is generally possible to have a coding length of up to 1023 symbols, so 1 sector of data is one code word.

FIG. 15 shows a typical code structure of a conventional error correction coding and decoding method, and in particular a (418, 410) Reed-Solomon code.

Herein, "418" is the code symbol length and "410" is the information length. Four symbols can be corrected. In FIG. 15, 30 is a removed part, 31 is a real information data symbol part, 32 is a check symbol part and 36 is a dummy symbol part.

The Reed-Solomon code shown in FIG. 15 actually has a length of 1023 symbols, but it is coded assuming that the 605 symbols of the removed part 30 are 0. Further if 1 sector is 512 bytes, there will be 4096 bits, i.e. 4 bits short of the number necessary to assign 10 bits/symbol. The 4 bit dummy symbol 36 is therefore added, and with a real information data symbol part 31 of 410 symbols, 8 symbols of 10 bits are generated for the check symbol part 32.

Next, a coding circuit for generating check bytes in the Reed-Solomon code of FIG. 15 will be described with reference to FIG. 16. Herein, data input and output of check symbols are handled in 8 bit units so that these operations can be normally performed by a flash memory. In FIG. 16, 22 is an 8 bit information data input terminal, 19 is a 8 bit/10 bit conversion circuit, 23 is a coding circuit for Reed-Solomon codes on a GF (2E10), 26 is a 8 bit check symbol output terminal, and 29 is a 10 bit/8 bit conversion circuit.

The operation of the structure in FIG. 16 will be described. Check symbols of the Reed-Solomon code are first generated in the coding circuit 23, for which purpose the circuit 23 is first cleared to "0".

First, 8 bit information data is input from an information data input terminal 22, and then input to the 8 bit/10 bit conversion circuit 19. When 10 bit information has accumulated in the 8 bit/10 bit conversion circuit 19, this information is input to the coding circuit 23.

When the entire real information data symbol part 31 is input to the coding circuit 23 including the 4 bits of the dummy symbol part 36 in FIG. 15, the 8 symbol (80 bit) check symbol part 32 is obtained. This means there is no need to calculate the removed contribution of the code part 30.

The check symbol part 32 is subjected to a 10 bit/8 bit conversion by a 10 bit/8 bit conversion circuit from the top down, and check byte data is output from the check symbol output terminal 26 every 8 bits. In other words, 10 byte data is output as check symbols.

Next, a conventional decoding method and in particular a syndrome calculation will be described with reference to FIG. 17. The construction of FIG. 17 assumes a flash memory having also a data erasure check function. In FIG. 17, 1 is a data input terminal for inputting 8 bit received data, 5 is a Galois field summing circuit on a GF (2E10), 7 is a 10 bit register, 8 is a Galois field coefficient multiplying circuit on a GF (2E10), 9 is a syndrome output terminal, 20 is a FF check circuit for checking whether or not all 8 bit data is "1",, i.e. whether or not it is "FF" in terms of HEX code, and 21 is an erasure check flag output terminal.

First, error correction decoding is performed, it being assumed that the register 7 is first cleared to 0. Received data input from the data input terminal 1 is input to the 8 bit/10 bit conversion circuit 19. When 10 bit data has accumulated in the 8 bit/10 bit conversion circuit 19, a Galois field summation is performed on this information and the output of the Galois field coefficient multiplying circuit 8 in the Galois field summing circuit 5. The summation result is input to the register 7.

The output of the register 7 is transmitted to the input terminal of the Galois field coefficient multiplying circuit 8.

The state of the register 7 when all of the real information data symbol part 31 check symbol part 32 has been input, is the syndrome Sj, and this is output from the syndrome output terminal 9.

At that time, even if a slip of symbol units should occur when the leading data symbol of the Reed-Solomon code is "0", there is still a possibility that error correction decoding will take place with the slip still present as Reed-Solomon codes are cyclic codes.

On the other hand when data is erased in a flash memory, all data becomes "1", but it is necessary to verify whether or not the erasure has been performed without any errors.

In this case, 8 bit data is input to the FF check circuit 20 from the data input terminal 1, and if "0" is detected in even one bit, an error flag is output by the erasure check flag output terminal 21.

Now conventionally, when error correction is performed, decoding of codes formed from product codes is performed after first storing them in a memory. FIG. 18 is a block diagram of a circuit showing an example of such a case. In the figure, 59 is a buffer memory, 60 is a syndrome circuit, 63 is an error position/magnitude detecting circuit which determines error position and magnitude, 64 is a correction circuit, and 65 is a post-correction decoded data output terminal.

In the above construction, coded data input from the data input terminal 1 is stored in the buffer memory 59. Subsequently interleaving is undone, the data is converted to a coded sequence and input to the syndrome circuit 60. Based on the syndrome thereby obtained, error positions and magnitudes are determined by the error position/magnitude detecting circuit 63, error position data in the buffer memory 59 is read by the correction circuit 64, the errors are corrected, and the data is written to the buffer memory 59. In the case of product codes, this decoding operation is repeated a plurality of times, and all data is decoded and output by the decoded data output terminal 65.

When the aforesaid operations are performed by one buffer memory, input of received data, output to the syndrome circuit, input/output of error position data and output of corrected data must be performed by time division. In particular, when decoding is repeated a plurality of times as with product codes, a buffer memory having high speed access must be used.

To ensure reliability of the memory, 1 bit error correction and 2 bit error detection are often used, a typical example being the (72, 64) binary linear code. Herein, "72" is the bit coding length and "64" is the bit information length, i.e. there are 8 check bits.

In such a decoding circuit, all coded bit data is often decoded in parallel, and there is often another circuit to detect errors. This type of code is described for example in "Fault Tolerance Systems" (Edited by the Institute of Electronics Information Communications of Japan (Denshi Joho Tsushin Gakkai) by Yoshihiro Toma, first edition published on Jun. 10, 1990).

FIG. 19 is a block diagram of a conventional decoding circuit for (72, 64) binary linear codes. In the figure, 66 is an 8 bit input OR circuit to which signals from the syndrome circuit 60 are input, 67 is a 72 bit input NOR circuit to which signals from the error position/magnitude detecting circuit 63 are input, 68 is a 2 bit AND circuit to which the outputs of the 8 bit input OR circuit 66 and 72 bit input NOR circuit are supplied, and 49 is a correction impossibility detection flag output terminal for outputting a correction impossibility detection flag from the 2 input AND circuit 68.

In the aforesaid construction when memory error correction is performed, as the data path has a parallel construction, 72 bit coded data is first input to the syndrome circuit 60. In the syndrome circuit 60, an 8 bit syndrome is generated from received data and output. The error position/ magnitude detecting circuit 63 checks whether or not an 8 bit pattern of bit positions comprising a check bit determined by a parity check matrix is identical with the syndrome. The result is sent to the 72 bit input NOR circuit 67 and correction circuit 63, and at that time, 64 bits of an information part are sent to the correction circuit 64. The correction circuit 64 performs an XOR operation on the received information bits and the error detection result of each bit, and the result is output from the decoded data output terminal 65.

In this coding, error detection is performed on 2 bit errors. This means that if the syndrome is not "0" and it is not identical to a correctable pattern of a parity check matrix of 72 bits coding length, correction is impossible and an error is detected. The 8 bit input OR circuit 66 checks that the 8 bits of the syndrome are not "0", the 72 bit input NOR circuit 67 checks whether the error is not a 1 bit error, and 2 AND circuit 68 calculates the logical product of these two check results, which logical product is output from the correction impossibility detection flag output terminal 49.

The aforesaid construction and operation are also described for example in Japanese Patent Publication Sho 53-5099 (applied for by D. W. Price, Nov. 8, 1972). Problems which this Invention Attempts to Solve As the conventional error correction coding/decoding method has the construction described hereinabove, it leaves a large number of problems as described hereinbelow.

The first problem is that if a 1 symbol per 10 bit Reed-Solomon code is used for 8 bit input/output data, an 8 bit/10 bit conversion circuit and a 10 bit/8 bit conversion circuit are necessary, symbol clocks must be generated both for 8 bits and 10 bits, and a bit clock is required.

The second problem is that a special circuit is required to check whether data is all "1" to verify erasure of a flash memory.

The third problem is that even when a slip occurs in an Reed-Solomon code in symbol units, correction decoding may leave the slip unchanged since the Reed-Solomon code is cyclic.

The fourth problem is that when coded data is stored in a memory, since input of received data, input/output to the decoding circuit and output of the decoded result are performed on a time division basis, a high speed access memory is required in order to perform a plurality of decoding operations.

The fifth problem is that, to output an error correction impossibility flag in a (72, 64) binary linear code used for memory error correction, it is necessary to perform a 1 bit error check in 72 bits, and this requires a circuit to perform a logical computation on the result. This makes a long delay time inevitable, and requires a circuit with a large number of gates to perform the computation.

This invention was conceived to overcome the aforesaid problems inherent in the prior art. It aims to provide an error correction method and circuit which performs error correction, coding and decoding by means of a simple structure with very high reliability by handling only 8 bit symbols and eliminating redundant circuits.

MEANS USED TO OVERCOME THE ABOVE PROBLEMS

Figure 1:
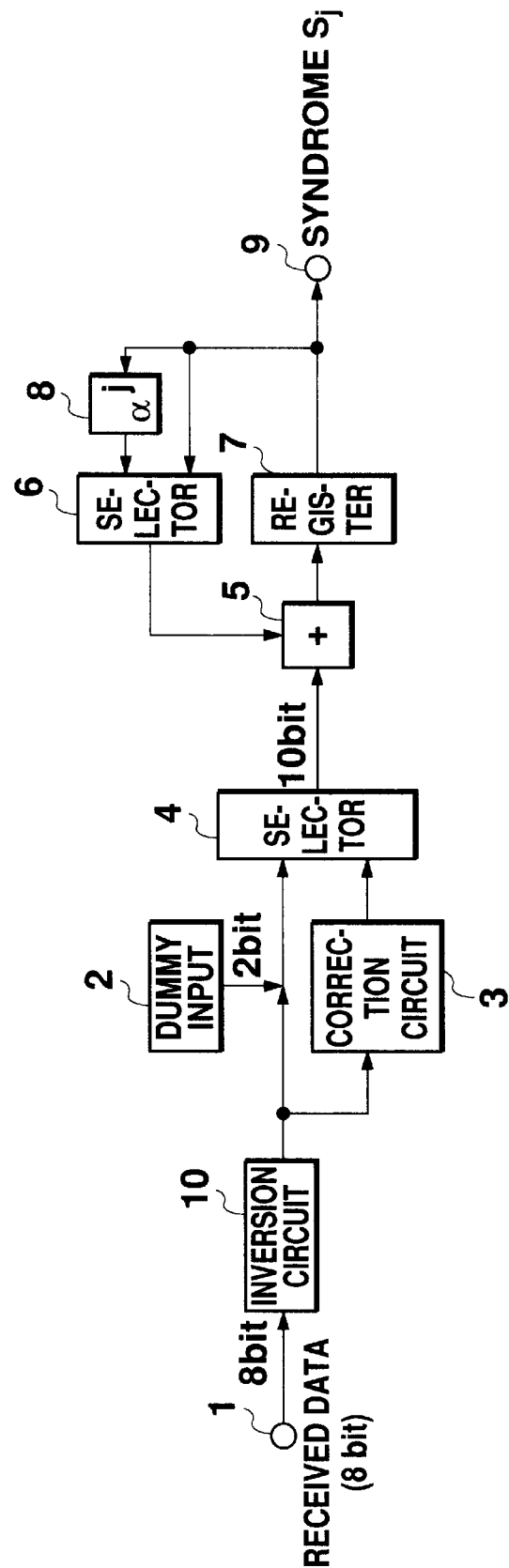
FIG. 1 is a block diagram of a circuit for implementing an error correction coding/decoding method according to a first embodiment of this invention.

In order to achieve the aforesaid objectives, this invention provides, as an error correction coding/decoding method, a method of coding/decoding Reed-Solomon codes formed of larger symbols than information data symbols, comprising a process wherein dummy data is set in the symbols of the Reed-Solomon codes exceeding the bit length of the information symbols and this dummy data is not transmitted, an adding process wherein, during decoding, dummy data is first added to the symbols of an information part as bit data which is insufficient to be a symbol of a Reed-Solomon code, a transmitting process wherein, when a check symbol is transmitted, parts corresponding to the bit lengths of information symbols are transmitted without modification, and parts exceeding the bit lengths of information symbols are transmitted together in bit lengths equivalent to the bit lengths of the information symbols after the parts corresponding to the bit lengths of information symbols are transmitted, a process wherein, when decoding is performed, dummy bits are added and a syndrome calculation is performed without modification on check symbol parts corresponding to the bit lengths of information symbols transmitted first, a syndrome calculation is performed based on check bit data on data transmitted together in parts exceeding the bit lengths of information symbols transmitted later, and a Galois field summation process is performed on a syndrome based on information obtained first and check symbols.

In order to achieve the aforesaid objectives, this invention provides an error correction coding/decoding method comprising a process wherein, when performing coding and decoding of error correction codes, a 0/1 inversion is performed on all information and check bytes before transmission, and a 0/1 inversion is performed on the read data before decoding.

In order to achieve the aforesaid objectives, this invention further provides an error correction coding/decoding method for coding and decoding of error correction codes whereof the coding length has been shortened, this method comprising a process for adding a data pattern to the removed part to generate check symbols so that data in which the information and check symbols are all "1" becomes a code word, then transmitting only information and check symbols, and on the decoding side, a process for adding syndrome data corresponding to data in the removed part to a syndrome generated by the information and check symbols.

In order to achieve the aforesaid objectives, this invention further provides an error correction coding/decoding method for coding and decoding of error correction codes whereof the coding length has been shortened, this method comprising a process for adding a code data pattern to the removed part, which immediately precedes the information symbols so as to generate check symbols, then transmitting only information and the check symbol, and on the decoding side, a process for adding a syndrome corresponding to the code data pattern added to the removed part, to a syndrome generated by the information and check symbols.

In order to achieve the aforesaid objectives, this invention further provides an error correction coding/decoding circuit which stores received error correction coded data from a data input part in a buffer memory and performs a plurality of decoding operations according to the error correction code, this circuit comprising syndrome calculating means which performs a syndrome calculation on input data and on the data in the buffer memory, and means which performs decoding by selecting either one of these two syndromes and correcting errors.

In order to achieve the aforesaid objectives, this invention further provides an error correction coding/decoding method wherein error correction coding and decoding comprises a process which treats the weighting of a parity check matrix only as "1", "3" or "7" in a (76, 64) binary linear code that performs 1 bit error correction and 2 bit error detection.

In the error correction coding/decoding method, when 8 bits of information are processed as one symbol and a Reed-Solomon code is formed of larger symbols, dummy bits are added to insufficient bits so as to make one symbol. Eight bits of Reed-Solomon check symbol thus formed are transmitted after the information symbol in the same way as information, while the surplus bits of the check symbol are transmitted together later. In decoding, dummy bits are added to the 8 bit information symbols and 8 bit check symbols, a syndrome calculation is performed, and a correction calculation is applied to the bit data in the check symbols grouping the surplus bits which are transmitted later.

In an error correction coding/decoding method, all information and check symbols are inverted before recording on a flash memory. When this data is read, by inverting and decoding, the all "1" of the erasure state of the flash memory can be processed as all "0" of coded data. In an error correction coding/decoding method, dummy information is set in the removed part to form a codeword even when the information and check bytes are all "1". On the decoding side, syndrome data corresponding to data in the removed part is added to the syndrome generated by information and check symbols.

In an error correction coding/decoding method, code data is assigned to the head of the removed part. In coding, a check symbols are generated based on this coded data, and only information and check symbols are transmitted. In decoding, a syndrome corresponding to this code data pattern is added to the syndrome generated by this information and check symbols.

In an error correction coding/decoding circuit, either the syndrome corresponding to input data or syndrome corresponding to buffer memory data are selected, and error correction and decoding are performed based on this selection. This allows a reduced frequency of access to the buffer memory, and a lower operating speed of the buffer memory.

In an error correction coding/decoding method, during error coding and decoding, the weighting of the parity check matrix is arranged to be "1", "3", "7" in a (76, 64) binary linear code which performs 1 bit error correction and 2 bit error detection. In order to detect whether error correction is impossible, the weighting of the syndrome is found, and the detection is performed based on this weighting.

DESCRIPTION OF THE PREFERRED EMBODIMENTS

Embodiment 1

FIG. 1 is a block diagram of a circuit used to implement an error correction coding/decoding method of this invention, in particular showing the decoding circuit up to syndrome computation of a shortened (520, 512) Reed-Solomon code derived from a 10 bit per 1 symbol (1023, 1015) code.

In the figure, 2 is 2 bits of dummy data which are surplus bits in 1 symbol (e.g. a dummy data input circuit to input "00"), 3 is a syndrome correction circuit which generates syndrome data according to the surplus part of a check symbol (2 bits×8 symbols), 4 is a selector which selects one of two 10 bit data, 5 is a Galois field summation circuit on a GF (2E10), 7 is a 10 bit register, 8 is a Galois coefficient multiplying circuit on a GF (2E10), 6 is a selector which selects two 10 bit data, 9 is a syndrome output terminal, and 10 is a 0/1 inversion circuit connected to a data input terminal 1.

The first embodiment resolves the first and second problems mentioned heretofore.

The operation of the aforementioned construction will now be described.

In the construction of FIG. 1, assume that all code data is recorded after 0/1 inversion. The code data input from the data input terminal 1 is data which is inverted in 8 bit units. This data is inverted in the 0/1 inversion circuit 10, i.e. if all the bits in the recorded data are "1", they all become "0" after inversion. Therefore, when a flash memory is erased and all the erased data becomes "1", a syndrome check can be performed when the output of the 0/1 inversion circuit is a code with all "0".

This solves the second problem.

Next, the solution of the first problem will be described.

First, in the 512 bytes of information transmitted first, the two surplus bits are coded for example as "0". On the receiving side also, dummy data (e.g. "0") is added by the dummy data input circuit 2, and input to the Galois field summation circuit 5 via a selector 4 as 10 bit symbols.

Also input to the Galois field summation circuit 5 is data from the register 7 that has passed through the Galois field multiplying circuit 8 and is output from the selector 6. This circuitry performs the same computation as a conventional syndrome circuit.

Next, 8 symbol check bytes are input, however, only 8 bit data which is the same as in information symbols is input. As in the case of information symbols, dummy data (e.g. "0") is added from the dummy data input circuit 2, input to the Galois field summation circuit 5 from the selector 4 as 10 bit symbols, and a syndrome calculation is performed as with information symbols.

Finally, as a code sequence, 2 surplus bits in each check symbol are grouped into 8 bit units, and 2 symbols are input as 8 bit data. This data is input to the syndrome data correction circuit 3, and the following $GF(2^{10})$ Galois field coefficient multiplication and addition is performed.

$$\alpha^{4j} (d_7\alpha^{3j}+d_6\alpha^{2j}+d_5\alpha^{j}+d_4) +(d_3\alpha^{3j}+d_2\alpha^{2j}+d_1\alpha^{j}+d_0)$$

Here, di is 000(HEX), 100(HEX), 200(HEX) or 300(HEX) in terms of HEX codes. The correction data thus obtained is added by the Galois field summation circuit 5 to the syndrome formed by data up to the immediately preceding check symbol. The syndrome formed by data up to the immediately preceding check symbol is a symbol from the register 7 which has passed through the selector 4, and is output via the selector 6. The addition result of the Galois field summation circuit is stored in the register 7. This is then output as a syndrome Sj from the syndrome output terminal 9.

One example of the construction of the syndrome data correction circuit 3 will now be described based on the block diagram of FIG. 10. In the figure, 37 is an 8 bit received data input terminal, 38–40 are Galois field coefficient multiplying circuits on a GF(2E10), 41–44 are Galois field summation circuits on a GF(2E10), 45 is a 10 bit register, 46 is a Galois field multiplying circuit on a GF(2E10), and 47 is a correction data output terminal.

The operation of the aforesaid construction will now be described.

According to this example, for an 8 bit input, the upper 2 bits of 4 check symbols are input together which gives an input of 2 symbols for 8 check symbols. The symbols input in 8 bits from the received data input terminal 37 are then input in a sequence of decreasing order of check symbols respectively to the Galois coefficient multiplying circuits 38–40 having the coefficients $\alpha^{3j}$, $\alpha^{2j}$, $\alpha^{j}$, and the result is added by the Galois field summation circuits 41–43.

As only the upper 2 bits can be "1" in this process, the logic circuit concerning the lower 8 bits can be omitted, and the size of the circuit can be reduced.

The result of the Galois field summation circuit 43 is input to the Galois field summation circuit 44, added to the output of the Galois field coefficient multiplying circuit 46, and input to the register 45. The initializing value of the register 45 is "0", and its output is input to the Galois field coefficient multiplying circuit 46. The Galois field coefficient multiplying circuit 46 performs the same role as that of the Galois field coefficient multiplying circuit 8 of FIG. 1, however it performs 4j-th power calculation in which 4j is 4th order of that of the Galois field multiplying circuit 8. This is due to the fact that the upper 2 bits of the check bytes of 4 symbols are assigned to 8 bit data. The upper 2 bits of the next check symbols are processed in the same way, and stored in the register 45. This completes the calculation of correction data.

Next, a second example of the construction of the syndrome data correction circuit 3 will be described with reference to the block diagram of FIG. 11. The construction of FIG. 11 is obtained by removing the register 45 and Galois field summation circuit 44, and adding a selector 48.

The operation of this construction will be described.

Figure 10:
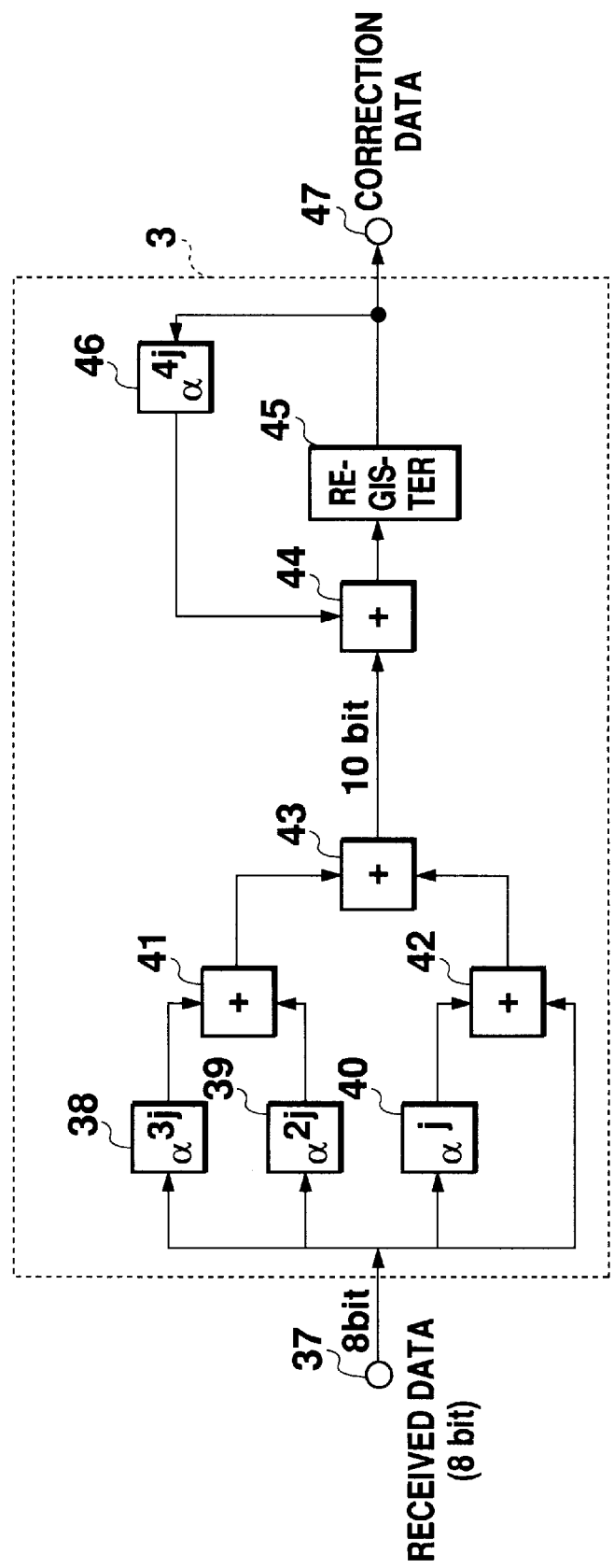
FIG. 10 is a block diagram showing a first example of a syndrome data correction circuit according to the construction of FIG. 1.
Figure 11:
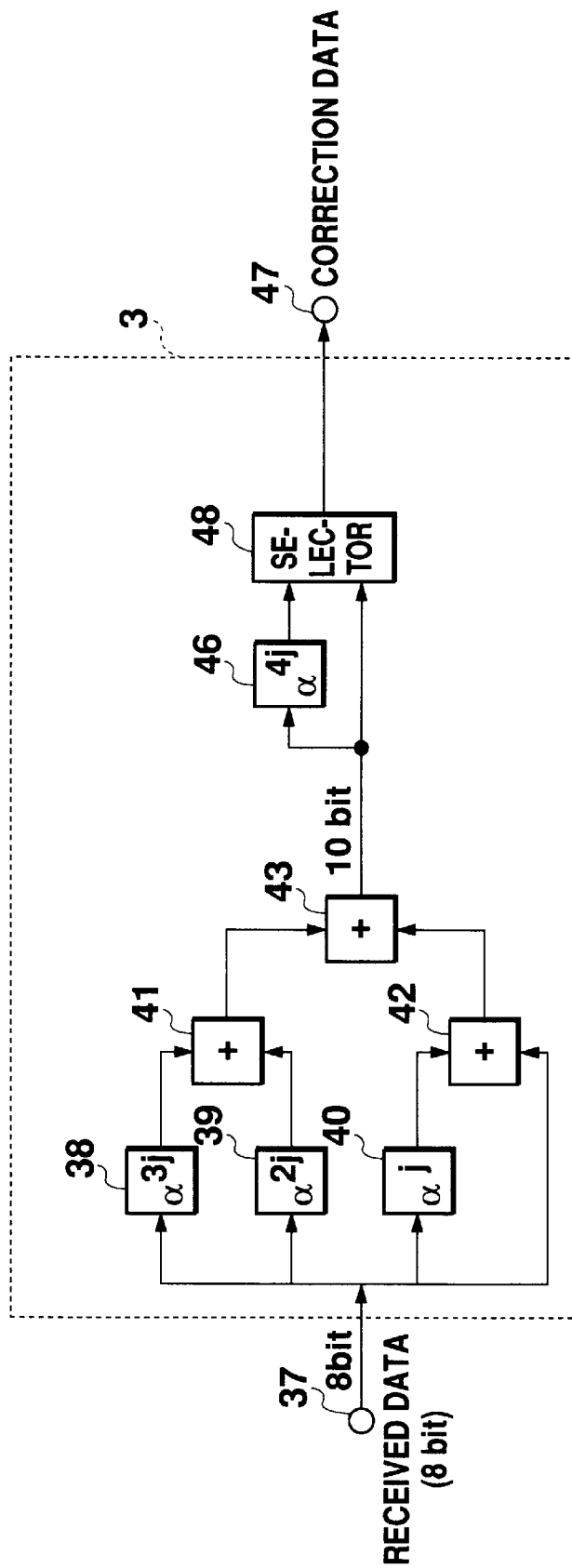
FIG. 11 is a block diagram showing a second example of a syndrome data correction circuit according to the construction of FIG. 1.

In the construction of FIG. 11, the operation of the Galois field summation circuit 43 is the same as that of FIG. 10.

However, the output of the Galois field summation circuit 43 obtained in response to the input symbols hereinabove passes through the Galois field coefficient multiplying circuit 46, via the selector 48, and is output from the correction data output terminal 47.

This result is added by the Galois field summation circuit 5 to the output result of the register 7 which has passed through the selector 4 of FIG. 1 and via the selector 6, and is stored in the register 7. The output of the Galois field summation circuit 43 due to the next 8 bit symbol passes without modification through the selector 48, and a syndrome is obtained by the same operation as for the preceding symbol.

Embodiment 2

Figure 2:
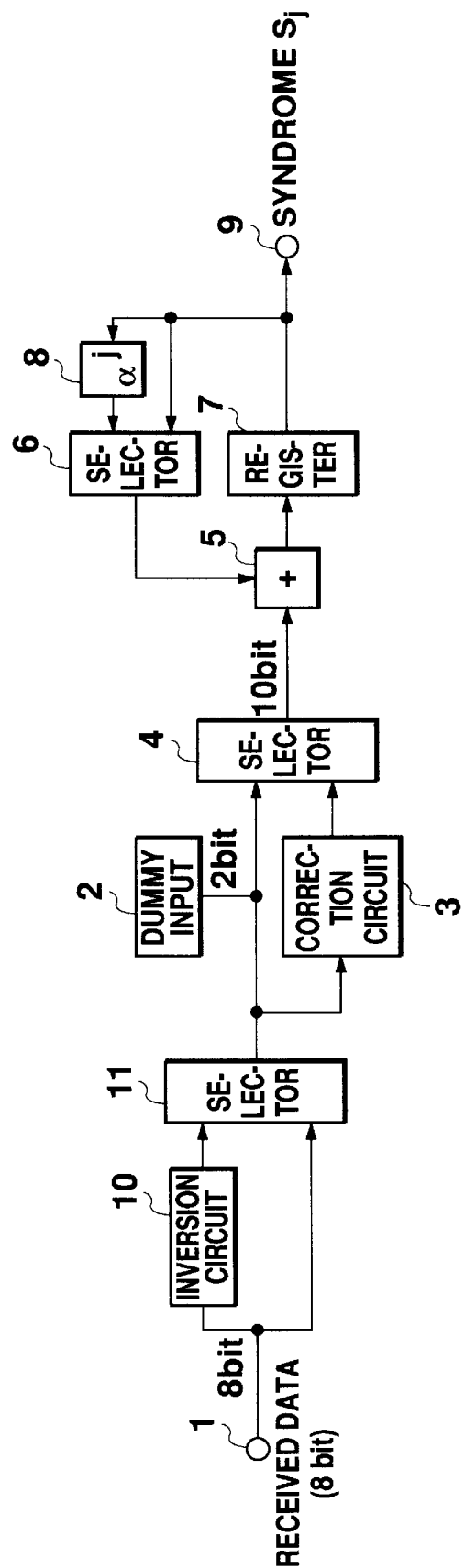
FIG. 2 is a block diagram of a circuit for implementing an error correction coding/decoding method according to a second embodiment of this invention.

FIG. 2 is a block diagram for implementing the error correction coding/decoding method of a second embodiment of this invention, and in particular for resolving the second problem.

According to the first embodiment, as all coded data was inverted before recording, it was impossible to distinguish whether the information was a code of all "0" or whether it had become all "1" due to erasure, however the construction of FIG. 2 solves this problem.

In FIG. 2, 11 is a selector for two 8 bit data inputs, this selector either reading an input from the data input terminal 1 via the 0/1 inversion circuit 10, or directly.

According to the aforesaid construction, under normal conditions, a direct read syndrome calculation is performed on received data from the data input terminal 1 via the selector 11. Data input via the 0/1 inversion circuit 10 is selected and read for calculating a syndrome only when a flash memory erasure check is performed.

In this case, ordinary coded data is stored without performing 0/1 inversion.

It will of course be understood that although the second embodiment shows an example where the 0/1 inversion circuit 10 and selector 11 are controlled separately, this may be implemented also by an XOR circuit providing both.

Embodiment 3

Concerning the second problem, the first and second embodiments disclosed a method of checking flash memory erasure, i.e. checking that the state of the memory was all "1". The third embodiment proposes a method of checking flash memory erasure simply by the syndrome initialization setting of the register 7. Concerning the third problem, this third embodiment also proposes a method of detecting slip even when a slip of symbol units occurs.

Figure 8:
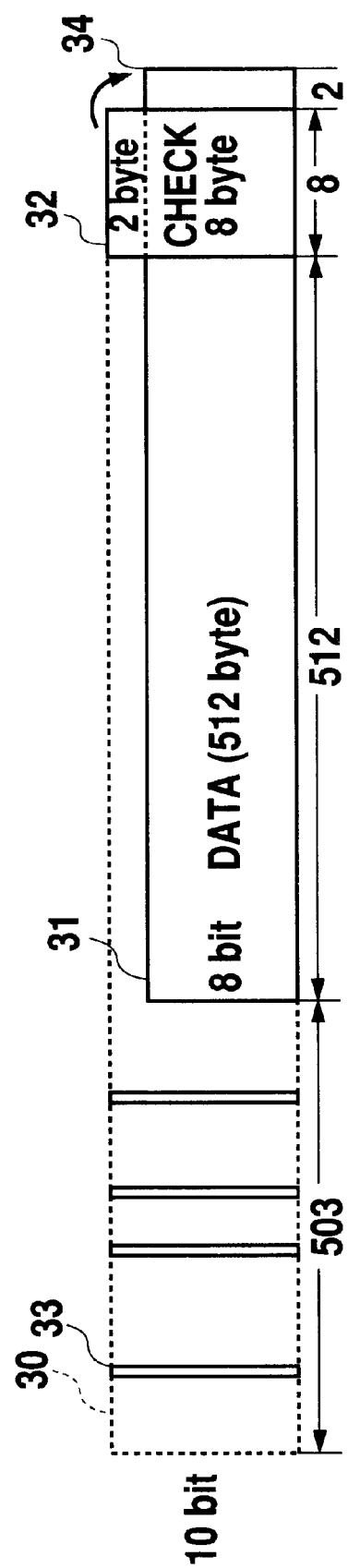
FIG. 8 is a diagram describing the structure of a (520, 512) Reed-Solomon code in implementing the third embodiment of this invention.

FIG. 8 shows the layout of a (520, 512) Reed-Solomon-code used when the third embodiment is implemented. This code structure may be applied also to resolving the first problem in the first embodiment.

In FIG. 8, 30 is a compressed code part, 31 is real information data symbol part, 32 is a check symbol part, 33 is a dummy symbol inserted to make a code even when the information and check symbols are all "1", and 34 is an addition check symbol formed by collecting the upper 2 bits of each 10 bit check symbol, and adding them to the end of the code sequence.

Figure 15:
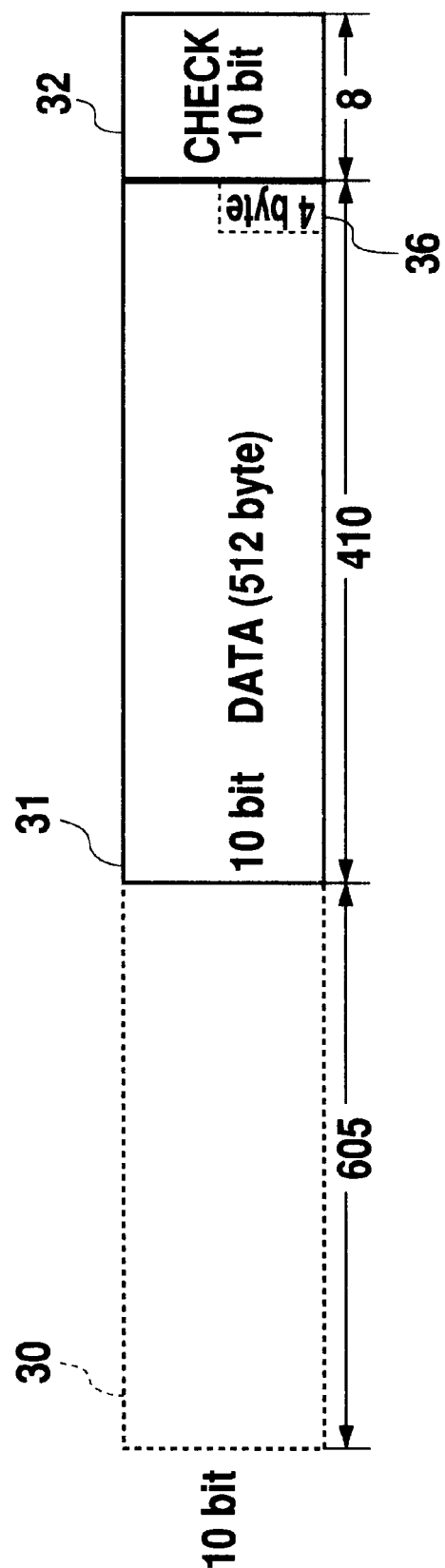
FIG. 15 is a diagram describing a typical code structure in a conventional error correction coding/decoding method.
Figure 16:
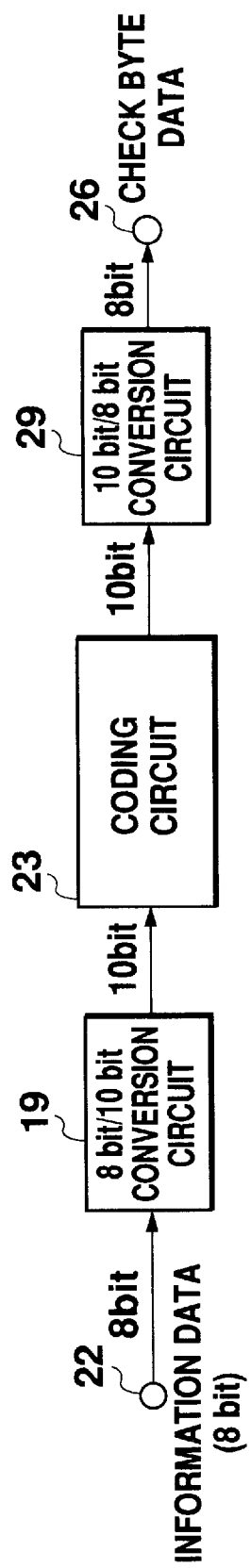
FIG. 16 is a block diagram of a coding circuit for generating the check bytes of the Reed-Solomon code of FIG. 15.
Figure 17:
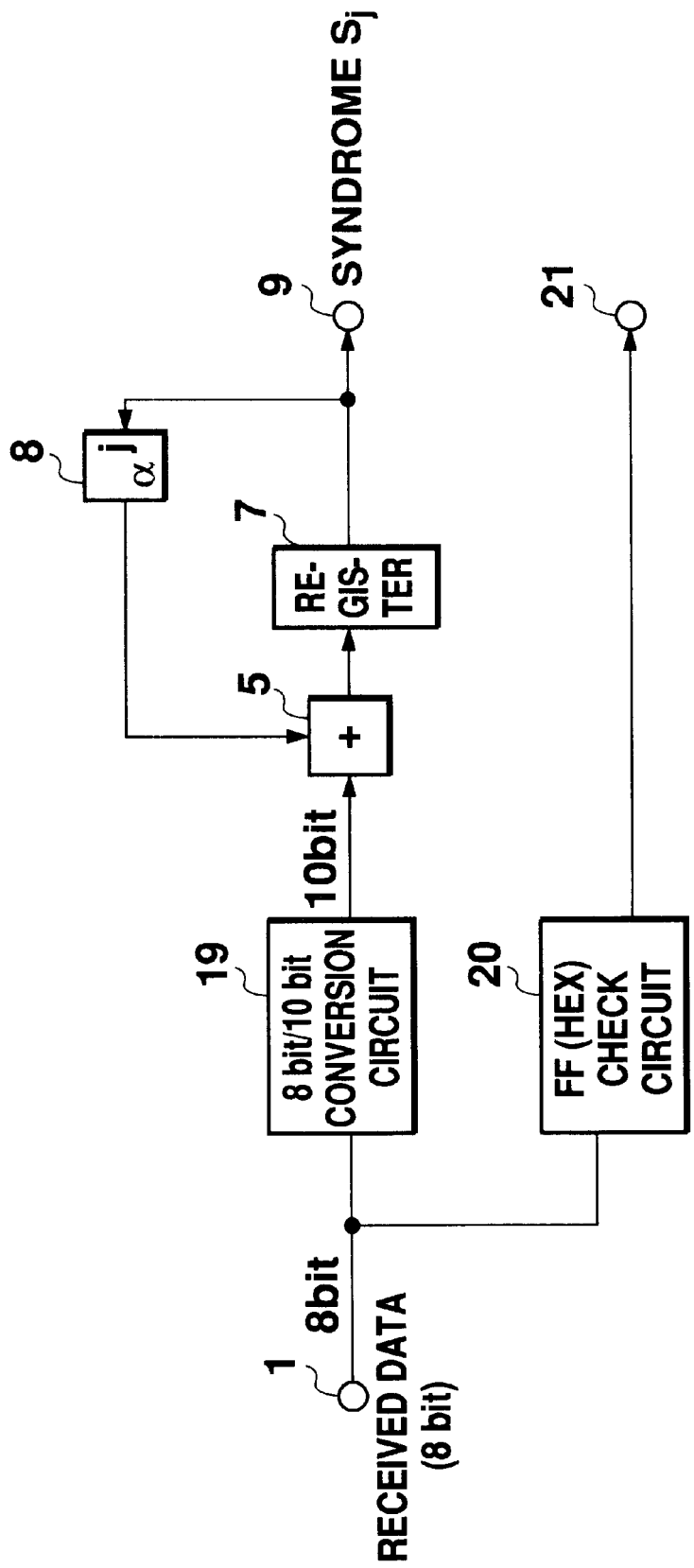
FIG. 17 is a block diagram of a decoding circuit in a conventional error correction coding/decoding method.

The Reed-Solomon code wherein one symbol comprises 10 bits normally allows a code length of 1023 symbols. Herein, unlike the conventional example of FIG. 15, the 8 bit real information data symbol part 31 which is the storage unit of the flash memory is taken as one symbol, and dummy bits, e.g. "0", are inserted into the upper 2 bits. This makes 8 bit/10 bit conversion unnecessary.

The check symbol part 32 generated from this information symbol has 10 bits per symbol, and there is no guarantee that the upper 2 bits are fixed data. Only the lower 8 bits are disposed immediately after the 8 bit information symbols, the upper 2 bits being grouped into 8 bit units, and the two addition check symbols 34 are added as extra symbols after the check symbol part 32 comprising check bytes. All of these operations may be performed by symbol block processing.

Next, the code structure which resolves the second and third problems will be described with reference to FIG. 8. Taking a (1023, 1015) Reed-Solomon code having 10 bits/symbol as an example, assume the primitive polynomial is:

$$P(X)X^{10}+X^3+1$$

and the generating function is:

$$G(X) = \prod_{j=508}^{615} (X - \alpha^j)$$

where $\alpha^i = \beta^{49i}$
and β is a primitive element of P(X). In this case, when the leading part of the dummy data is in the 0 position, i.e. the leading part of the real information symbol part 31 is in the 503th position, 19D(HEX) is set in position 278 and 0AB (HEX) is set in position 454 as the dummy symbol 33 in the removed data part 30, then the 8 symbols of the check symbol part 32 will all be "1" if the real information data symbol part 31 in FIG. 8 is all "1" and the upper 2 bit parts of the information symbols are "0". In other words, the state when the flash memory is erased and all data is "1" may be regarded as a (520, 512) Reed-Solomon code in FIG. 8.

Next, the coding circuit for the code structure shown in FIG. 8 will be described.

Figure 6:
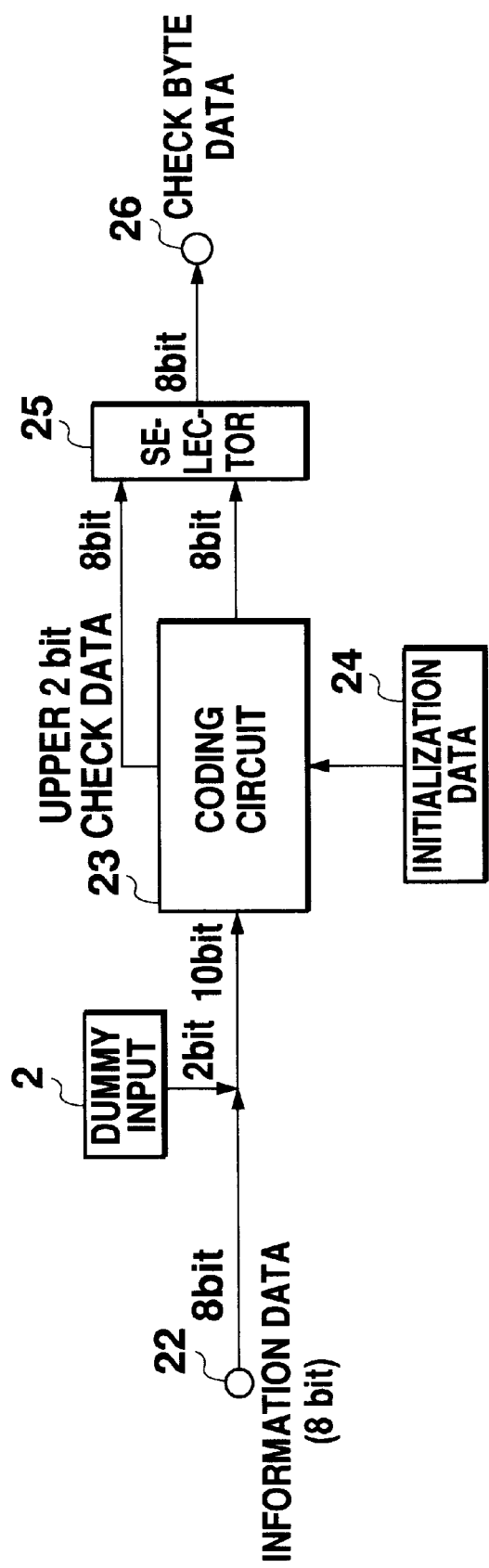
FIG. 6 is a block diagram of a circuit corresponding to the code structure shown in FIG. 8 in the error correction coding/decoding method according to the third embodiment of this invention.

FIG. 6 is a block diagram showing a typical layout of a coding circuit corresponding to the code structure in FIG. 8. In the figure, 22 is an 8 bit information data input terminal, 2 is a dummy data input circuit for the upper 2 bits of information symbols, 23 is a coding circuit capable of setting an initial position of for example a linear feedback shift register on a $GF(2^{10})$, 24 is a coding circuit initialization data setting circuit for initializing the register of the coding circuit 23, 25 is a selector which selects as output either the lower 8 bits of check symbols or symbols formed by bundling the upper 2 bits into 8 bits, and 26 is a check symbol output terminal for outputting check byte data.

As is clear from the figures, this circuit is practically no different in terms of computing volume and circuit size than a conventional coding circuit.

The operation of the aforesaid construction will now be described.

First, before 8 bit information data is input by the information data input terminal 22, the dummy symbol 33 in FIG. 8 is input and calculated by the coding circuit 23. However as the dummy symbol 33 is a fixed value, the state of the coding circuit prior to input of the following information data can first be calculated. For example, assuming the coding circuit 23 is a linear feedback shift register type as has conventionally been used, wherein check symbols are obtained when information symbols are input, and considering the check symbols as polynomial order coefficients, the states of the register during the calculation are, in descending order, 174(HEX), 0B6(HEX), 105(HEX), 0EA (HEX), 26B(HEX), 260(HEX), 18F(HEX), 0D7(HEX). This calculation result may be supplied as an initialization value from the coding circuit initialization data setting circuit 24 to the register of the coding circuit 23. The initialization may be achieved by directly supplying data to, for example, the set terminal or reset terminal of a flip-flop circuit.

Subsequently 2 bits, e.g. "0", are added by the 2 bit dummy data input circuit 2 to the 8 bit information data input from the information data input terminal 22, and the result is fed as 10 bit symbol data to the coding circuit 23. When inputting of 512 symbols of 8 bit information data is complete, 8 check symbols are obtained in the coding circuit 23, however each of these check symbols comprises 10 bits. To deal with this problem, the lower 8 bits of each check symbol are first output from the check symbol output terminal 26 via the selector 25, then the upper 2 bits of each check symbol are grouped together in 8 bit units and output from the terminal 26 via the selector 25. In this way, all the data can be processed as symbol clocks of 8 bit information data.

Figure 7:
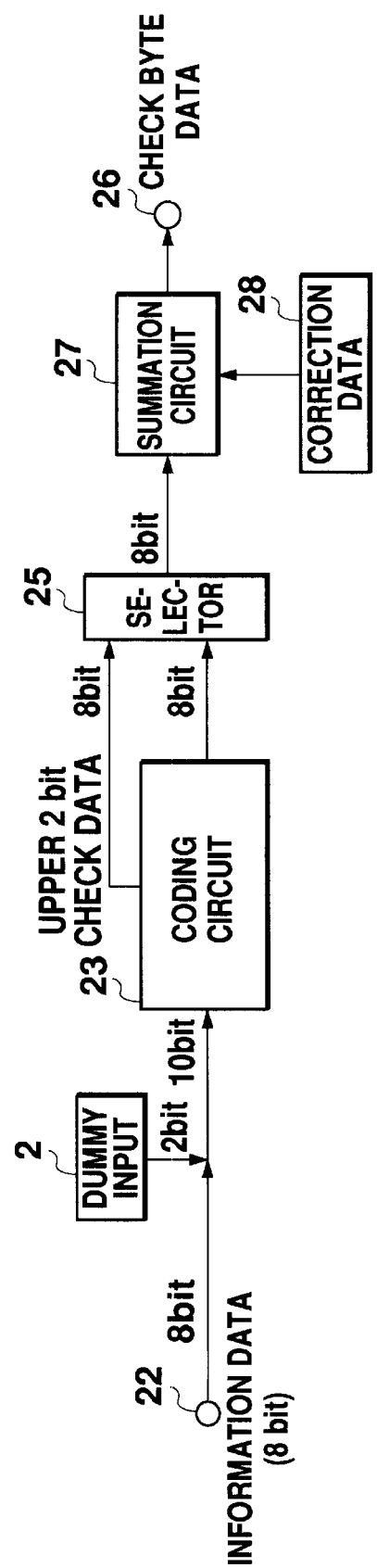
FIG. 7 is a block diagram showing another example of a circuit in the error correction coding/decoding method according to the third embodiment of this invention.

Next, the method of resolving the second and third problems will be described. FIG. 7 is a typical construction for achieving this. 27 is a Galois field summation circuit comprising an 8 bit XOR gate, and 28 is a check symbol correction data setting circuit 28 for supplying correction data to the Galois field summation circuit 27. As can be seen from the figure, the construction of this circuit up to the output of the selector 25 is essentially identical to that of FIG. 6. There is however no circuit to set an initialization value, the circuit 23 being cleared to "0" prior to input of information data.

The operation of the aforesaid construction will now be described.

In the construction of FIG. 7, apart from the fact that the initialization setting of the coding circuit 23 is "0", the construction is basically the same as that of FIG. 6. The dummy symbol supplied as a fixed value is processed as follows. As the Reed-Solomon code is a linear code, the check symbol corresponding to the dummy symbol 33 in FIG. 8 may be added to the check symbol obtained from the initialization setting of "0" by a Galois field summation via the Galois field summation circuit 27 from the check symbol correction data setting circuit 28. Herein, the check symbols corresponding to the dummy symbol 33 are, in descending order, 04A(HEX), 015(HEX), 3AF(HEX), 294(HEX), 125 (HEX), 09F (HEX), 02B(HEX), 274 (HEX). As the selector 25 outputs data 8 bits at a time, the output of the check symbol correction data setting circuit 28 is, in descending order, 4A(HEX), 15(HEX), AF (HEX), 94(HEX), 25(HEX), 9F (HEX), 2B (HEX), 74(HEX), OE(HEX), 42(HEX). The output of the check symbol correction data setting circuit 28 is then added to the output of the selector 25 by a Galois field summation in the Galois field summation circuit 27, and the result output from the check symbol output terminal 26.

Next, an example of a decoding circuit of the third embodiment will be described. According to this invention, decoding is characterized by a syndrome calculation, so a syndrome circuit part will be described as in the case of the first embodiment.

Figure 3:
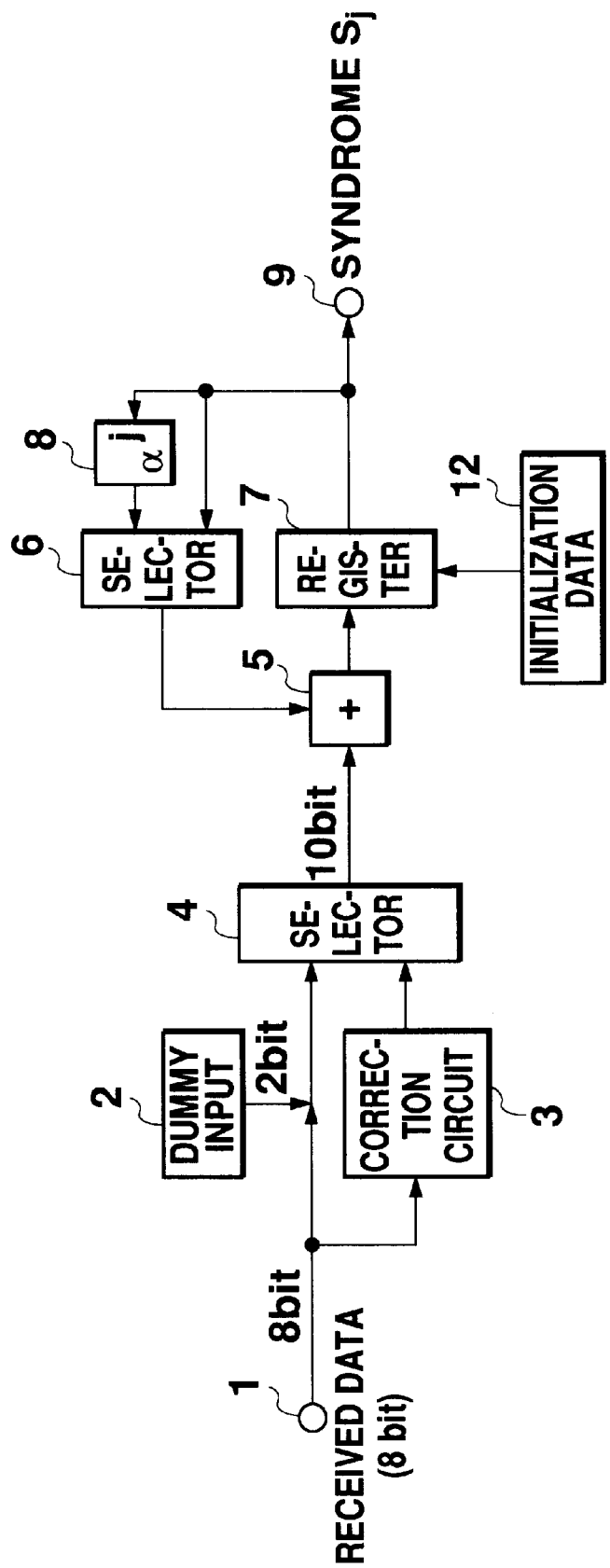
FIG. 3 is a block diagram in a first example of a decoding circuit in an error correction coding/decoding method according to a third embodiment of this invention.

FIG. 3 is a block diagram of a decoding circuit applied to the third embodiment. A difference from the construction of FIG. 1 is that syndrome initialization data setting means 12 is provided instead of the 0/1 inversion circuit 10.

The operation of the aforesaid construction will now be described.

In this case, the dummy symbol 33 in FIG. 8 is not input to received data that has been received in 8 bit units. In a similar way to the operation of the coding circuit of FIG. 6, therefore, the intermediate result of a syndrome calculation corresponding to the dummy symbol 33 immediately prior to input of information data to the register 7 is first calculated, and set in syndrome initialization data setting means 12. Using parameters similar to those of the preceding example, syndromes $S_0$–$S_7$ are set, i.e.:

$S_0$=09C(HEX)
$S_1$=1FB(HEX)
$S_2$=026(HEX)
$S_3$=10F(HEX)
$S_4$=145(HEX)
$S_5$=343(HEX)
$S_6$=248(HEX)
$S_7$=102(HEX).

The remainder of the operation is the same as that of the construction of the first embodiment excepting that there is no 0/1 inversion circuit 10.

Figure 4:
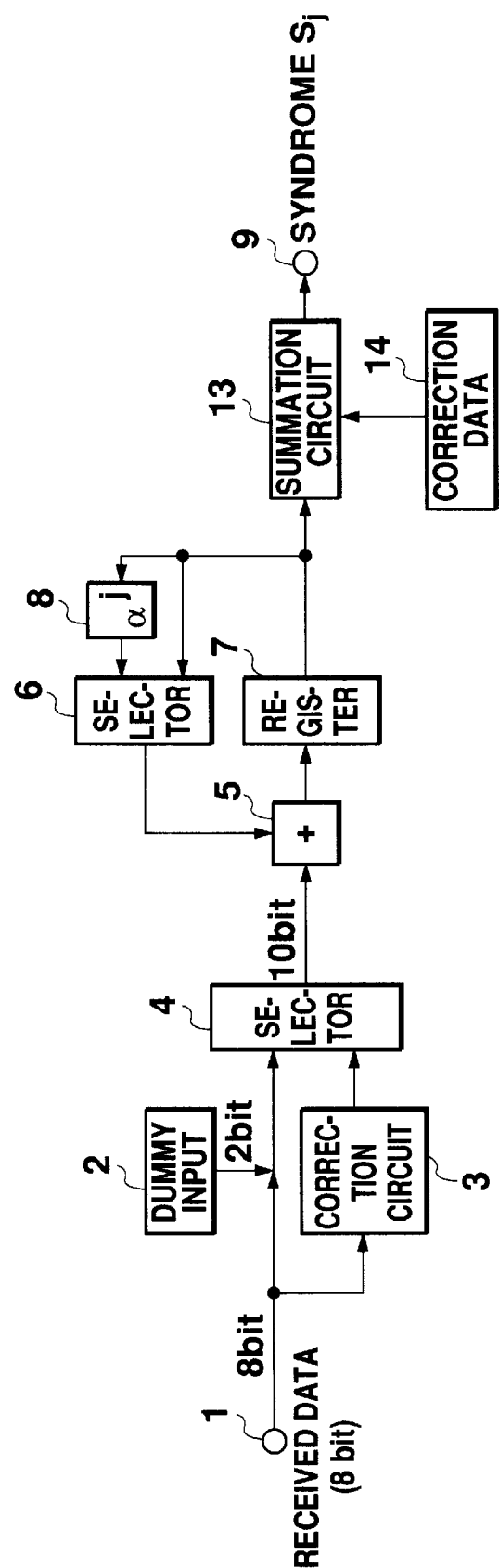
FIG. 4 is a block diagram in a second example of a decoding circuit in the error correction coding/decoding method according to the third embodiment of this invention.

Next, the method whereby correction is made by syndrome data for the dummy symbol 33 in FIG. 8 after calculating syndromes for information data, will be described as was done for the coding circuit described in FIG. 7. FIG. 4 is a block diagram showing the layout of this coding circuit. A syndrome correction data setting circuit 14 is provided instead of syndrome correction data setting means 12 in FIG. 6. Also, 13 is a Galois field summation circuit 13 which performs a Galois field summation on a $GF(2^{10})$, this circuit 13 comprising an XOR gate.

The operation of the construction of FIG. 4 is the computation performed by that of FIG. 6, excepting that the initialization data setting of the register 7 of the syndrome circuit part is all "0".

When all received data has been input, syndromes are obtained and these syndromes are output from the syndrome output terminal 9, syndrome numbers of the dummy data in FIG. 8 from the syndrome correction data setting circuit 14 are respectively added to the syndromes from received data in the Galois field summation circuit 13. Using the parameters of the preceding example, this correction data is respectively set for the syndromes $S_0$–$S_7$ as follows.

$S_0$=193(HEX)
$S_1$=2AE(HEX)
$S_2$=2E4(HEX)
$S_3$=0D7(HEX)
$S_4$=34D(HEX)
$S_5$=17B(HEX)
$S_6$=0C6(HEX)
$S_7$=23A(HEX).

According to this invention, as a method of resolving the aforesaid second and third problems, an initialization is performed on the dummy symbol 33. Excepting for data which is all "1", therefore, the dummy data part is regarded as an error even when the received data has slipped in symbol units, hence there is a high probability of detecting a slip.

As in the case of the second embodiment, syndrome initialization data setting means 12 or the syndrome correction data setting circuit 14 are set to generate syndrome data related to the dummy symbol 33 in FIG. 8, and they may normally also be set to "0".

This embodiment has been discussed with regard to solving the first, second and third problems using Reed-Solomon codes composed of 10 bit symbols. However as in the case of this embodiment, solutions may be provided to the second and third problems also for shortened Reed-Solomon codes having, for example, 8 bit symbols.

Embodiment 4

Figure 9:
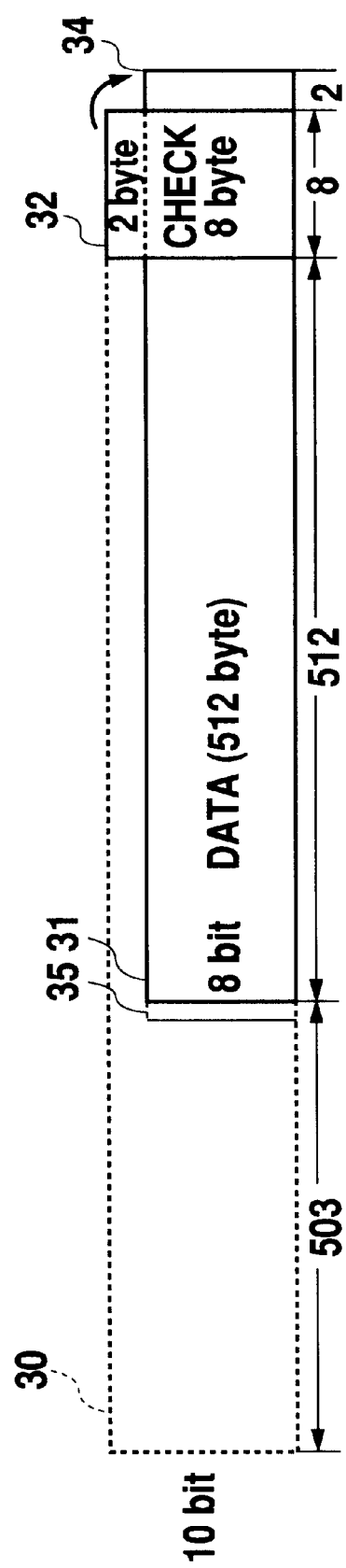
FIG. 9 is a diagram describing the structure of a code in implementing the fourth embodiment of this invention.

Next, an error correction coding/decoding method according to a fourth embodiment of this invention will be described. FIG. 9 is a typical code structure for implementing this embodiment which is actually an improvement of FIG. 8.

In FIG. 9, 35 is a removed code data insertion symbol part before the information data.

This embodiment is similar to the third embodiment in the way it resolves the second and third problems, however the method of solving the third problem is enhanced.

FIG. 9 will now be described. In a similar way to that of FIG. 8, a code pattern excluding "0" is set in a part of the code data insertion symbol part 35. For example, in the case of a Reed-Solomon code formed of k interleaves, a number from "1" to "k" is set at each interleave.

Coding and decoding are performed by the circuitry of FIG. 6, FIG. 7, FIG. 3 and FIG. 4 shown in the third embodiment.

Figure 5:
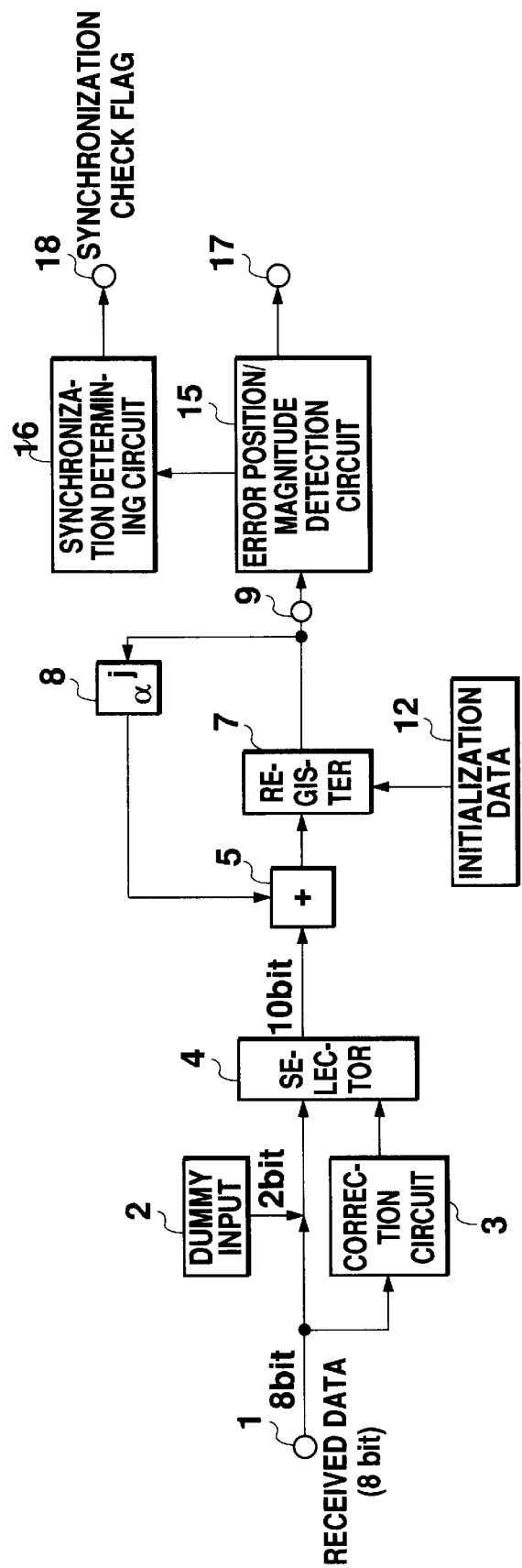
FIG. 5 is a block diagram of a circuit for performing a synchronization determination in an error correction coding/ decoding method according to a fourth embodiment of this invention.

Next, the method of determining synchronization in the code structure of FIG. 9 will be described. FIG. 5 is a block diagram of a typical construction used to achieve this object. In FIG. 5, the circuitry up to the syndrome output terminal is the same as that of FIG. 3. 15 is an error position/magnitude detecting circuit for finding error positions and error numbers, 16 is a synchronization determining circuit for determining whether or not synchronization is correct, 17 is an error position/magnitude output terminal for outputting error positions and magnitudes, and 18 is a synchronization check flag output terminal for tapping a synchronization check flag output by the synchronization determining circuit 16.

The operation of the aforesaid construction will now be described.

It is assumed that the desired data corresponding to received codes has been set as initialization data. In the error position/magnitude detecting circuit 15, an error position polynomial and error number polynomial are found from the resulting syndrome output by the syndrome output terminal 9, and error position and magnitude are then found by a chain search. In general, a chain search is performed on the coding length part of a received Reed-Solomon code, however according to this embodiment, the removed code part 30 comprising a removed part into which the code data insertion symbol part 35 has been inserted, is also checked. When correction is performed correctly, a "0" symbol run of the removed code length—1 continues, and the code data insertion symbol part 35 then appears. The state of the leading insertion data is monitored by the synchronization determining circuit 16, and when synchronization is observed, a flag is output by the synchronization check flag output terminal 18. At the same time, error positions and magnitudes including synchronization error information are output by the error position/magnitude output terminal 17.

Hence, from the "0" run of the removed part and the leading data embedded in the removed part, detection of and recovery from slips of symbol units can be achieved without increasing the coding length.

In implementing the method of this embodiment, the coding circuit and decoding circuit of FIG. 3 can be used without practically any modification. For example the method of the third embodiment may be used for flash memory erasure, and in most cases the method of the fourth embodiment may also be used.

Embodiment 5

Next, a fifth embodiment of the error correction coding/decoding method of this invention will be described. This embodiment provides solutions to problems, in particular the first problem, to which the preceding embodiments gave only incomplete solutions.

According to the embodiments described hereinabove, for example in the decoding of the code structures shown in FIG. 8 or FIG. 9, a non-correctable error exists when it is determined that there is an error in the dummy part of the upper 2 bits at an information symbol position.

When an error is made in respect of the whole of one symbol in the addition check symbols 34 added subsequently in FIG. 8 and FIG. 9, there is a possibility that the error could spread through, for example, the 4 symbols of a Reed-Solomon code. However as the total number of symbols added is small, this probability is small. Also, when it is detected that error correction is impossible in the event of an error and a loss correction is performed assuming that the added symbols have been lost, then if the magnitude of the error at the loss position appears only in the upper 2 bits of the check symbols, it may be determined that there is no error in the information symbols. In other words, error detection is performed from the error magnitude.

Regarding symbols formed by grouping together the upper 2 bits added later, a plurality of data transmissions or symbol recordings may be made, and majority decision decoding performed on the decoding side.

Another method is to consider symbols formed by grouping together the upper 2 bits added later as information, perform a second error correction coding suitable for transmission using for example an 8 bit symbol Reed-Solomon code or 4 bit symbol Reed-Solomon code, and add this check prior to transmission or recording. In this case, on the decoding side, the symbols formed by grouping the upper two symbols added later are decoded by the second error correction coding, and then decoding is performed on the information symbols.

Embodiment 6

Figure 12:
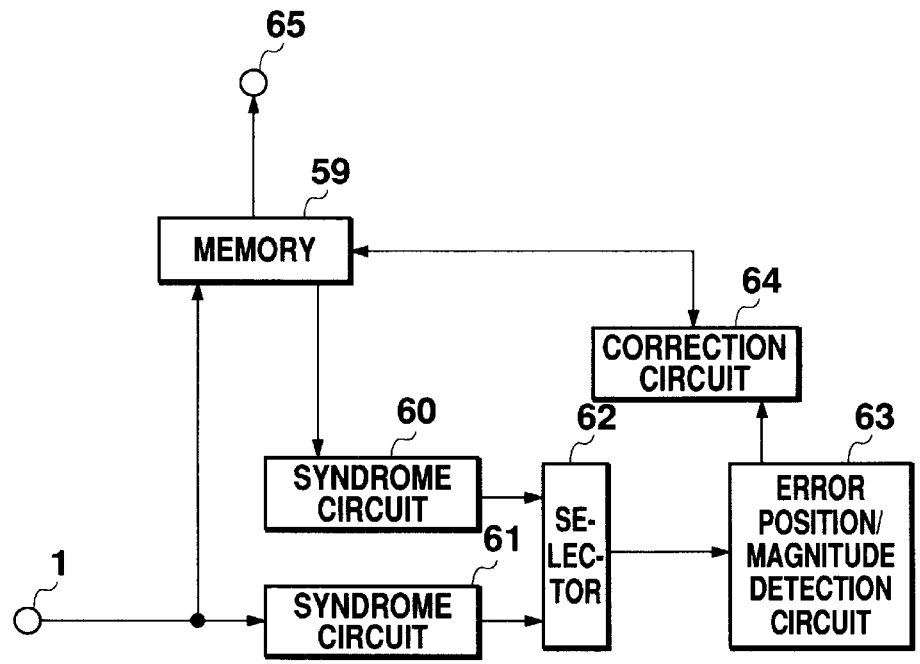
FIG. 12 is a block diagram of a circuit for implementing an error correction coding/decoding method according to a sixth embodiment of this invention.
Figure 18:
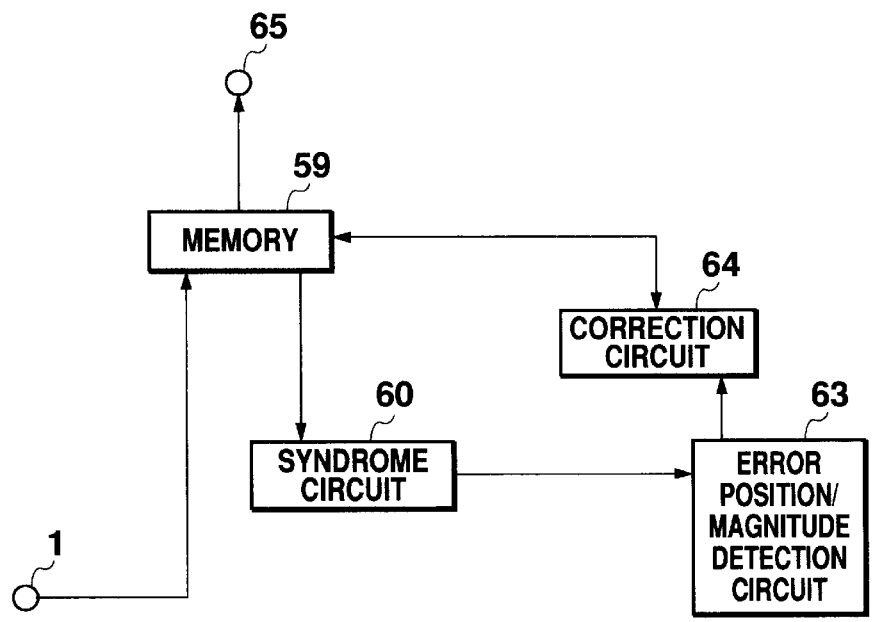
FIG. 18 is a block diagram of a circuit for decoding a product code structure in a conventional error correction coding/decoding method.

Next, a sixth embodiment of this invention will be described. FIG. 12 is a block diagram of a circuit for implementing the error correction coding/decoding method according to the sixth embodiment of this invention. This diagram shows a typical construction which particularly addresses the solution of the fourth problem. In the figure, 61 is a syndrome circuit for the data sequence input from the data input terminal 1 for inputting received data, and 62 is a selector which selects either data in the syndrome circuit 60 corresponding to data from the buffer memory 59, or data in the syndrome circuit 61 corresponding to data from the data input terminal 1, and inputs the result to the error position/magnitude detection circuit 63. The remaining features of the construction are the same as those of FIG. 18.

The operation of the aforesaid construction will now be described.

A code sequence input from the data input terminal 1 is stored in the buffer memory 59, and is simultaneously input to the syndrome circuit 61. The syndrome circuit 60 also performs a syndrome calculation on code sequences excluding code sequences which have just been received.

The selector 62 selects data respectively from the syndrome circuits 60, 61 on a time division basis, and inputs it to the error position/magnitude detection circuit 63. In the error position/magnitude detection circuit 63, error positions and magnitudes are determined according to the input syndromes, and transferred to the correction circuit 64. The correction circuit 64 reads data corresponding to error positions from data stored in the buffer memory 59, corrects errors, and returns the data to the buffer memory 59.

Data access between the buffer memory 59 and syndrome circuit 60 is therefore less by the amount of the input coding length, and more reliable even if the access speed of the buffer memory 59 is slow. Hence, the buffer memory 59, which was formerly implemented by for example a costly SRAM, may now be implemented by an economical DRAM.

Embodiment 7

Figure 13:
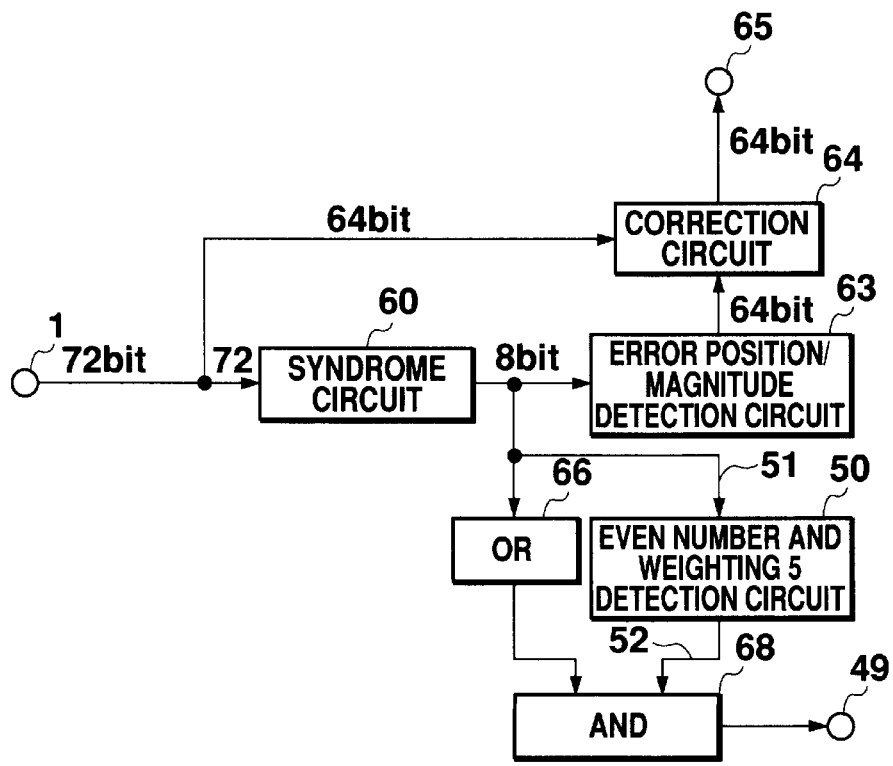
FIG. 13 is a block diagram of a circuit for implementing an error correction coding/decoding method according to a seventh embodiment of this invention.
Figure 19:
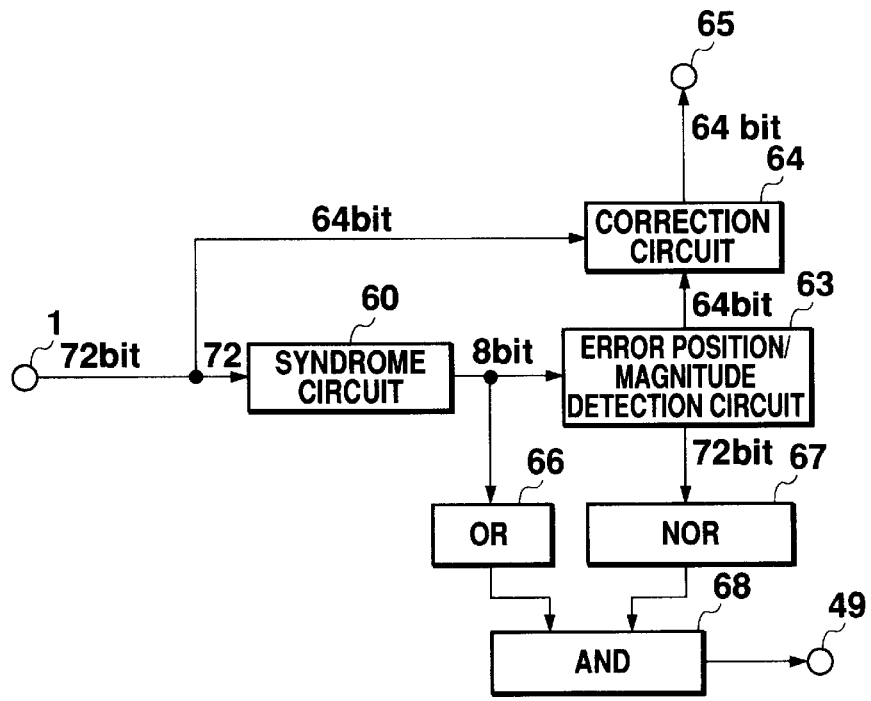
FIG. 19 is a block diagram of a decoding circuit for a (72, 64) binary linear code in a conventional error correction coding/decoding method.

Next, a seventh embodiment of this invention will be described. FIG. 13 is a block diagram of a circuit for implementing the error correction coding/decoding method according to the seventh embodiment of this invention. This diagram shows a typical construction which particularly addresses the fifth problem. In the diagram, 51 is an 8 bit syndrome signal output by the syndrome circuit 60, 50 is an even number and weighting "5" detection circuit for detecting even numbers and a weighting of "5" from the syndrome signal 51, and 52 is an even number and weighting "5" detection signal line which outputs a "1" signal when even numbers and a weighting of "5" are detected by the circuit 50. The remaining features of the construction are, with the exception of the 72 bit input NOR circuit 67, identical to those of FIG. 19.

The code which performs 1 bit error correction and 2 bit detection may for example comprise a structure of bit sequences having a parity check matrix with different odd number weightings. This is also described in the aforementioned references. In a (72, 64) binary linear code, the parity check matrix is 8 bit, combinations of states with odd number weightings being as follows:

Weighting 1=8

Weighting 3=56

Weighting 5=56

Weighting 7=8.

Conventionally, the states with weightings "1", "3", "5" were selected to form a (72, 64) code, however according to this embodiment, the weightings "1", "3", "7" are used to form a code. In this case, even if the parity check matrix is:

$$H = \begin{bmatrix} 1111 & 1111 & 1111 & 1111 & 1111 & 0111 & 1110 & 0000 & 1000 & 1000 & 0000 & 0000 & 0000 & 0000 & 0010 & 0000 & 0000 & 0000 \\ 1111 & 0100 & 1110 & 1110 & 1000 & 1000 & 0001 & 1111 & 0110 & 0100 & 1000 & 1000 & 1000 & 1000 & 0001 & 1000 & 1000 & 1000 \\ 1110 & 1011 & 0001 & 1100 & 1110 & 1000 & 0001 & 1000 & 0001 & 0011 & 1111 & 0110 & 0100 & 0100 & 0000 & 0010 & 1000 & 1000 \\ 1000 & 1010 & 1000 & 1111 & 1001 & 1100 & 1000 & 1111 & 0001 & 0010 & 0100 & 0001 & 1111 & 0000 & 1000 & 0001 & 0100 & 0100 \\ 1100 & 1000 & 1100 & 1000 & 1100 & 1111 & 0001 & 0100 & 1001 & 0001 & 0010 & 1001 & 0010 & 1111 & 0100 & 1000 & 0010 & 0100 \\ 1101 & 1001 & 1000 & 0100 & 1000 & 1000 & 1110 & 0010 & 1110 & 0010 & 0001 & 0100 & 0001 & 1111 & 1000 & 0100 & 0001 & 1100 \\ 0100 & 1000 & 1010 & 1101 & 1010 & 1010 & 0100 & 0001 & 0100 & 1101 & 1100 & 1111 & 0001 & 0010 & 0100 & 0100 & 0100 & 0010 \\ 1100 & 1100 & 1001 & 1100 & 0001 & 1001 & 0010 & 0000 & 0010 & 1100 & 0011 & 0010 & 1110 & 0001 & 1100 & 1100 & 1100 & 0001 \end{bmatrix}$$

1 bit error correction, 2 bit error detection is still possible. Hence although in the syndrome calculation, the number of delay steps has not changed from the conventional minimum structure and there are 16 more XOR circuits, impossibility of correction may be directly detected from syndrome data. Error detection may therefore be performed rapidly and simply with a small overall amount of circuitry.

The operation of FIG. 13 will now be described from the above viewpoints.

In the code structure of this embodiment, all patterns of the odd number weightings "1", "3", "7" are used, hence syndrome data which does not correspond to this, i.e. even number weighting patterns excluding "0" and patterns with a weighting of "5" may be detected. Syndromes with "0" are detected by the 8 input OR circuit 66, and since the correction impossibility flag in the 2 bit AND circuit 68 is never "1", even numbers and the weighting of "5" may be detected by the even number and weighting "5" detection circuit 50.

Figure 14:
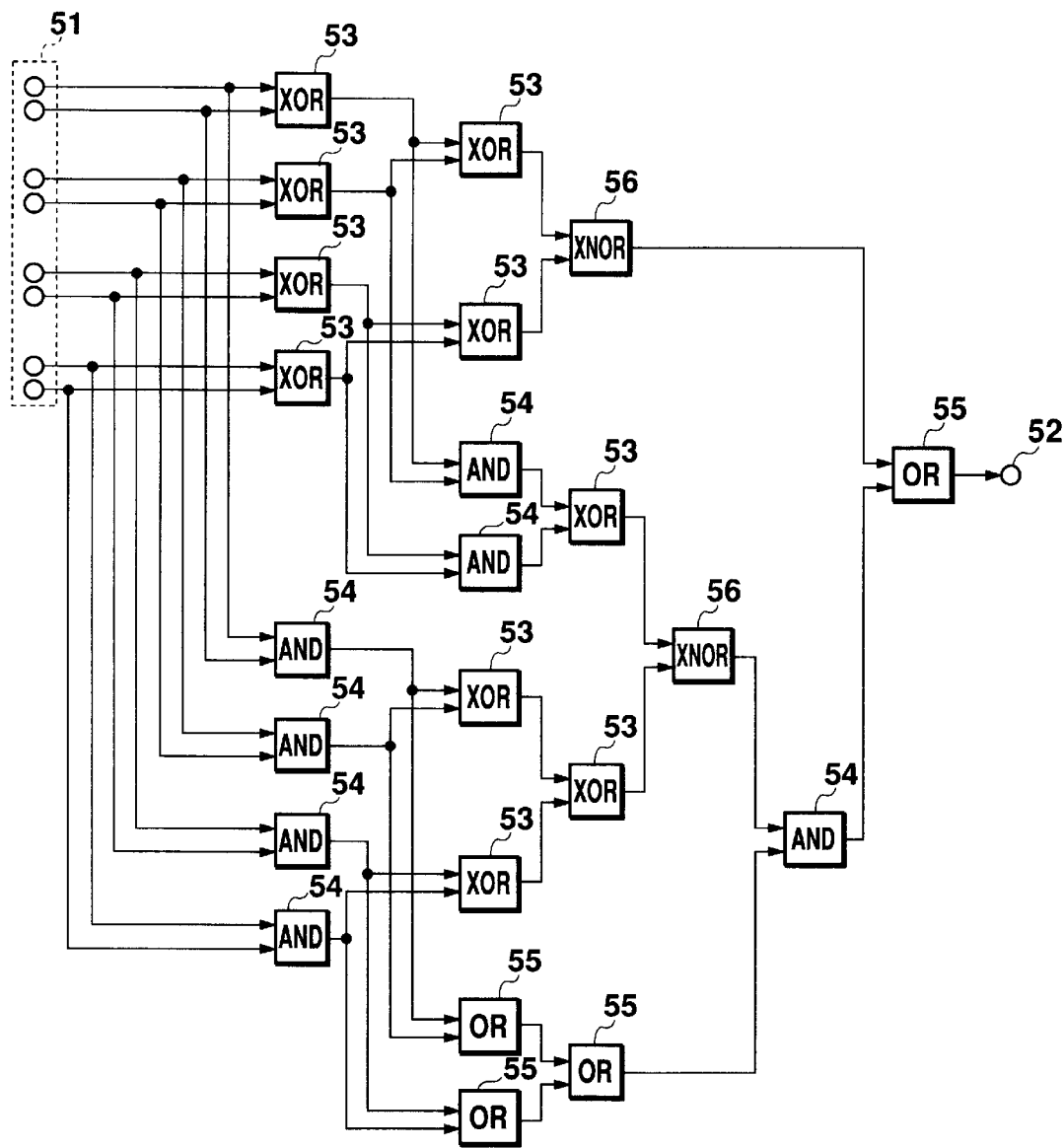
FIG. 14 is a block diagram of a circuit showing an example of the even number and weighting "5" detection circuit of FIG. 13.

FIG. 14 is a block diagram showing the detailed construction of the even number and weighting "5" detection circuit 50. In the figure, 53 is a 2 input XOR circuit, 54 is a 2 input AND circuit, 55 is a 2 input OR circuit and 56 is a 2 input XNOR circuit.

As can be seen from the figure, 71 2 input OR circuits or NOR circuits were formerly required, however according to the construction of the present embodiment, the same function is performed by a very small amount of circuitry.

It will of course be understood that although the aforesaid description has been given with regard to a (72, 64) binary linear code, it may be applied in the same way to codes of other code lengths.

As the error correction coding/decoding method of this invention has the aforesaid construction, it offers the various advantages stated hereinbelow.

Advantage 1

In regard to the first problem stated heretofore, this invention treats an upper part of information bits as dummy bits, and adds the upper 2 bits of a check symbol at a later time, in a Reed-Solomon code comprising a symbol having a longer bit length than an information symbol. Coding and decoding may therefore be performed without symbol conversion and using only a symbol clock, hence this method offers the advantage of high speed processing.

Advantage 2

In regard to the second problem stated heretofore, this invention sets dummy data in an inversion or a compressed part of a code sequence. An erasure check of a flash memory may therefore be performed using an error correction circuit, no special circuit is required for checking, and the circuit construction can consequently be simplified.

Advantage 3

In regard to the third problem stated heretofore, this invention duplicates code data in a compressed part and synchronization data is inserted. A synchronization check or recovery is therefore possible without increasing the information length or data length.

Advantage 4

In regard to the fourth problem stated heretofore, this invention provides a syndrome circuit corresponding to input data. Decoding is performed selectively by a selector and a conventional syndrome circuit. The access speed of a buffer memory may therefore be slower than in the prior art, and an economical memory may be used.

Advantage 5

In regard to the fifth problem stated heretofore, this invention allows 1 bit error correction in respect of all patterns of the weightings "1", "3", "7" in an 8 bit syndrome length. Detection of impossibility of correction may therefore be made simply by detecting even numbers excluding "0" and a weighting of "5" from the syndrome, and error detection may be performed using a more rapid, compact circuit than in the prior art.

What is claimed is:

1. An error correction coding/decoding method for coding and decoding Reed-Solomon codes formed of "large symbols" in a Galois field having more elements than the number of kinds of information symbols, said method comprising:

a transmitting process wherein dummy data is set in a part in Reed-Solomon codes formed of "large symbols"

exceeding the bit length of said information symbols, coding is performed, and after coding, only bit data remaining after the removal of this dummy data is transmitted, an adding process wherein, on the decoding side, dummy data is first added to the symbols of an information part as bit data which is insufficient to be a symbol of said Reed-Solomon codes, a transmitting process wherein, when a check symbol is transmitted, parts corresponding to the bit lengths of information symbols in said "large symbols" are transmitted without modification, a transmitting process wherein, when a check symbol is transmitted, parts in Reed-Solomon codes formed of "large symbols" exceeding the bit lengths of said information symbols are transmitted together after said exceeding parts are collected from a plurality of information symbols, grouped into bit lengths equivalent to the bit lengths of said information symbols, and transmitted, a process wherein, when decoding is performed, dummy bits are added and a syndrome calculation is performed without modification on check symbol parts corresponding to the bit lengths of information symbols in said "large symbols" transmitted first, and a syndrome calculation based on check bit data is performed on said data transmitted together in parts exceeding the bit lengths of said information symbols in said "large symbols' transmitted later, and a process which performs a Galois field summation on the calculation result of said syndrome based on information obtained first and check symbols, and the calculation result of said syndrome based on data exceeding the bit lengths of said information symbols transmitted later.

2. An error correction decoding method for Reed-Solomon codes formed of "large symbols" from information data symbols as defined in claim 1, said method comprising:

a process for treating a part corresponding to check symbols having parts exceeding the bit lengths of information symbols as an erasure part, and performing an erasure correction on this part, and a process which determines, when an error pattern corresponding to said erasure part obtained when said erasure correction is performed appears only in parts exceeding the bit lengths of information symbols in said erasure part, that an error has not occurred in parts corresponding to the bit lengths of said information symbols.

3. An error correction coding/decoding method for Reed-Solomon codes formed of "large symbols" from information data symbols as defined in claim 1 or claim 2, said method comprising:

a process for transmitting a plurality of parts corresponding to check symbols having parts exceeding the bit lengths of information symbols, and on the decoding side, a process for decoding information symbols by a majority decision based on said plural data which has been transmitted with respect to parts corresponding to check symbols having parts exceeding the bit lengths of information symbols.

4. An error correction coding/decoding method for Reed-Solomon codes formed of "large symbols" from information data symbols as defined in claim 1 or claim 2, said method comprising:

a process for coding by arbitrary error correction codes having check bits which are integral multiples of the symbol lengths of information data with respect to parts corresponding to check symbols having parts exceeding the bit lengths of information symbols, and on the decoding side, a process for decoding information symbols by decoding said arbitrary error correction codes with respect to parts corresponding to check symbols having parts exceeding the bit lengths of information symbols.

5. A coding circuit for Reed-Solomon codes formed of "large symbols" from information data symbols, said circuit comprising adding means which adds dummy data to information symbols, and output means which selects and outputs, as check symbol data, parts of check symbols corresponding to the bit lengths of information symbols, and parts of check symbols exceeding the bit lengths of information symbols grouped into bit lengths equivalent to the bit lengths of information symbols.

6. A decoding circuit for Reed-Solomon codes formed of "large symbols" from information data symbols, said circuit comprising adding means which adds dummy data to information symbols and parts of check symbols corresponding to bit lengths of information symbols, correcting means which performs a syndrome calculation on check symbols having parts exceeding the bit lengths of information symbols, and summing means which performs a Galois field summation on a syndrome from said parts corresponding to bit lengths of information symbols in information symbol check bytes obtained first, and a syndrome obtained by said correcting means.

7. A coding circuit comprising:

a Galois field summing circuit which, during coding, sets the result of a Galois field summation of check symbols based on dummy patterns previously obtained, as coded check symbols, and correction data input means which inputs correction data.

8. A decoding circuit comprising:

a Galois field summing circuit to perform a Galois field summation of first syndrome data based upon information symbols included in a Reed-Solomon code and second syndrome data, and correction data input means for generating the second syndrome data based upon data other than information symbols included in the Reed-Solomon code.

9. A coding circuit for coding a plurality of 8-bit symbols of information data with Reed-Solomon codes, comprising:

adding means for adding 2-bit data to said 8-bit symbols to be converted to 10-bit data;

Reed-Solomon coding means for calculating check symbols based on said converted 10-bit data;

first output means for selecting and outputting the lower 8 bits of each of said check symbols; and second output means for grouping the upper 2 bits of each of said check symbols to form data of integral multiple of 8 bits and outputting said data as a unit of 8 bits.

10. The coding circuit as defined in claim 9, wherein said Reed-Solomon coding means calculates said check symbol based on a compressed code part as well as on said converted 10-bit data, and a dummy symbol is included at a predetermined position of said compressed code part.

11. The coding circuit as defined in claim 10, wherein said dummy symbol has such a value that all the bits of the check symbol to be calculated by said Reed-Solomon coding means will be "1" if said plurality of 8-bit symbols of said information data are all "1".

12. The coding circuit as defined in claim 10, wherein said dummy symbol is a symbol immediately before said plurality of 8-bit symbols of said information data, and is a pattern inherent to the Reed-Solomon code concerned.

* * * * *

UNITED STATES PATENT AND TRADEMARK OFFICE
CERTIFICATE OF CORRECTION

PATENT NO. : 6,024,485

DATED : February 15, 2000

INVENTOR(S): Hideo YOSHIDA

It is certified that error appears in the above-identified patent and that said Letters Patent are hereby corrected as shown below:

Column 1, line 17, change "Code Theorem" to --Coding Theory--
Column 1, line 19, change "Hideo Imai" to --Hideki Imai--.

Signed and Sealed this

Twenty-fourth Day of April, 2001

Attest:

NICHOLAS P. GODICI

Attesting Officer     Acting Director of the United States Patent and Trademark Office